US007020954B2

(12) United States Patent
Hartmann et al.

(10) Patent No.: US 7,020,954 B2
(45) Date of Patent: Apr. 4, 2006

(54) APPARATUS FOR PLACING A SEMICONDUCTOR CHIP AS A FLIPCHIP ON A SUBSTRATE

(75) Inventors: Dominik Hartmann, Hagendorn (CH); Ruedi Grueter, Neuenkirch (CH)

(73) Assignee: ESEC Trading SA, Cham (CH)

( * ) Notice: Subject to any disclaimer, the term of this patent is extended or adjusted under 35 U.S.C. 154(b) by 687 days.

(21) Appl. No.: 10/086,405

(22) Filed: Feb. 28, 2002

(65) Prior Publication Data

US 2002/0162217 A1 Nov. 7, 2002

(30) Foreign Application Priority Data

May 7, 2001 (CH) ............................ 2001 0821/01

(51) Int. Cl.
*B29P 19/00* (2006.01)

(52) U.S. Cl. ............................ 29/760; 29/739; 29/740; 29/744; 29/834; 414/737

(58) Field of Classification Search .................. 29/740, 29/741, 739, 743, 759, 832, 834, 720; 414/752, 414/753, 737; 901/40, 47; 294/64.1
See application file for complete search history.

(56) References Cited

U.S. PATENT DOCUMENTS

| | | | | |
|---|---|---|---|---|
| 4,146,924 | A * | 3/1979 | Birk et al. | 700/259 |
| 4,601,627 | A | 7/1986 | Oka et al. | 414/225 |
| 5,049,029 | A | 9/1991 | Mitsui et al. | 414/744.5 |
| 5,084,959 | A | 2/1992 | Ando et al. | 29/740 |
| 5,415,693 | A * | 5/1995 | Yoneda et al. | 118/664 |
| 5,839,187 | A | 11/1998 | Sato et al. | 29/743 |
| 6,185,815 | B1 * | 2/2001 | Schindler | 29/740 |
| 6,640,423 | B1 * | 11/2003 | Johnson et al. | 29/740 |
| 6,915,563 | B1 * | 7/2005 | Bolde et al. | 29/762 |
| 2002/0162217 | A1 * | 11/2002 | Hartmann et al. | 29/740 |

FOREIGN PATENT DOCUMENTS

| | | |
|---|---|---|
| CH | 674 115 A5 | 4/1990 |
| CH | 82101 | 5/2001 |
| DE | 29 30 286 | 3/1960 |
| DE | 41 27 696 A1 | 2/1993 |
| EP | 0 330 831 B1 | 10/1995 |
| EP | 0772229 | 9/1996 |
| EP | 0 778 610 A1 | 6/1997 |
| EP | 0 877 544 A1 | 11/1998 |
| JP | 3029334 | 7/1991 |
| JP | 2002-343830 | * 11/2005 |
| WO | 99/60742 | 11/1999 |

OTHER PUBLICATIONS

Pantograph, Pantoja de la Cruz, pp. 151-152.

* cited by examiner

*Primary Examiner*—Minh Trinh
(74) *Attorney, Agent, or Firm*—Thelen Reid & Priest LLP; David B. Ritchie

(57) ABSTRACT

An apparatus for placing a semiconductor chip as a flipchip on a substrate has a flip device for flipping the semiconductor chip. The flip device is formed as a parallelogram construction which consists of a support bracket, a first and a second swivel arm and a connecting arm. A chip gripper is arranged on the connecting arm. A drive system serves the back and forth movement of the parallelogram construction between a first limit position where the chip gripper accepts the semiconductor chip and a second limit position where the chip gripper places the semiconductor chip on the substrate.

20 Claims, 4 Drawing Sheets

APPARATUS FOR PLACING A SEMICONDUCTOR CHIP AS A FLIPCHIP ON A SUBSTRATE

PRIORITY CLAIM

Figure 1:
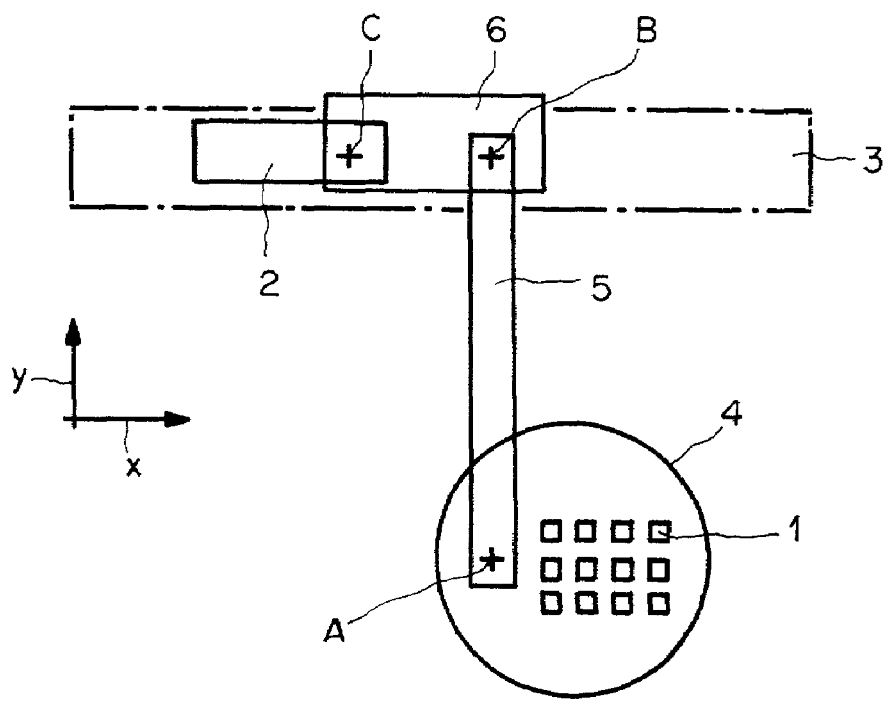

The present application claims priority under 35 U.S.C § 119 based upon Swiss Patent Application No. 2001 0821/01 filed on May 7, 2001.

FIELD OF THE INVENTION

The invention concerns an apparatus for placing a semiconductor chip as a flipchip on a substrate.

BACKGROUND OF THE INVENTION

Two types of machines are available on the market for the mounting of flipchips, namely so-called pick and place machines which guarantee a very precise placing of the flipchips on the substrate but which are comparatively slow and so-called die bonders which achieve a higher throughput but lower accuracy. Common to both types of machines is that the chip to be flipped is first taken from a wafer adhered to and expanded on a foil by means of a device known as a flipper, flipped and then transported to the substrate by the pick and place system and placed on it.

The object of the invention is to develop a device for the mounting of flipchips which places the flipchips on the substrate quickly and with high precision.

BRIEF DESCRIPTION OF THE INVENTION

The starting point of the invention is an automatic assembly machine known as a die bonder as is described, for example, in the U.S. Pat. No. 6,185,815, which is incorporated herein by reference, and which is sold by the applicant under the designation DB 2008. The semiconductor chips adhere to an expandable foil clamped onto a wafer ring. The wafer ring is positioned in two orthogonal directions by means of a wafer table. With this die bonder, the semiconductor chips are presented by the wafer table at a predetermined location A, picked by a pick and place system with a bondhead travelling back and forth at high speed and deposited at a predetermined location B on the substrate. In accordance with the invention, it is now foreseen to extend a die bonder of this type with a flip device for flipping the semiconductor chip. The flip device takes over the semiconductor chip from the bondhead at location B, transports the semiconductor chip to a location C, flips the semiconductor chip during transport from location B to location C, and deposits the semiconductor chip onto the substrate as a flipchip at location C. The flip device is designed as a parallelogram construction. The parallelogram construction consists of a support bracket, a first and a second swivel arm and a connecting arm. A chip gripper is arranged on the connecting arm. A drive system serves the back and forth movement of the parallelogram construction between a first limit position where the chip gripper accepts the semiconductor chip and a second limit position where the chip gripper places the semiconductor chip on the substrate.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 6:
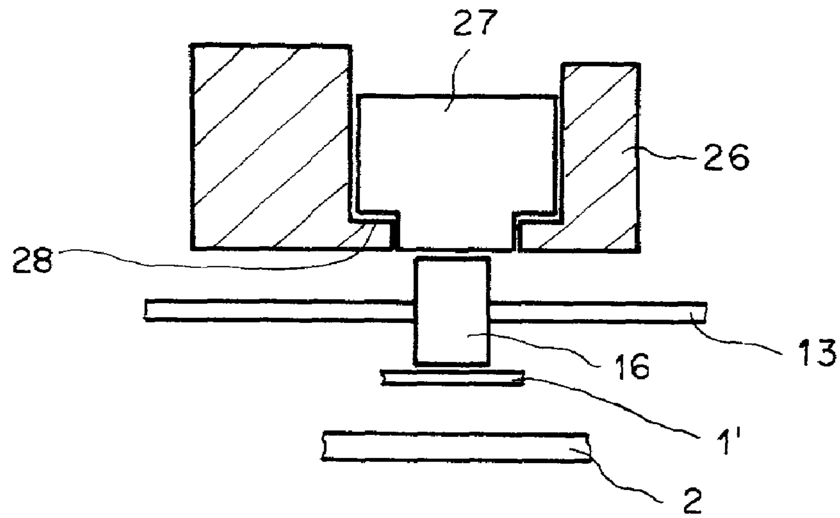
Figure 2:
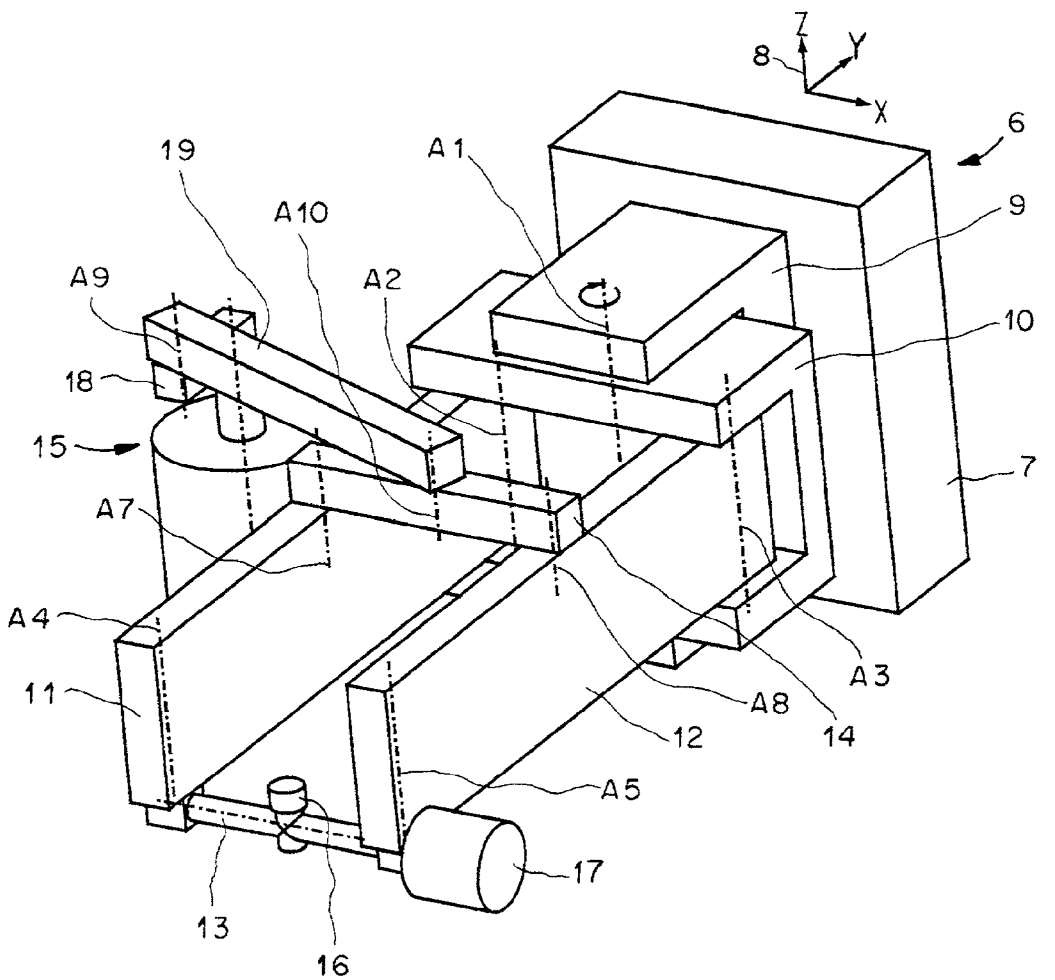
Figure 3A:
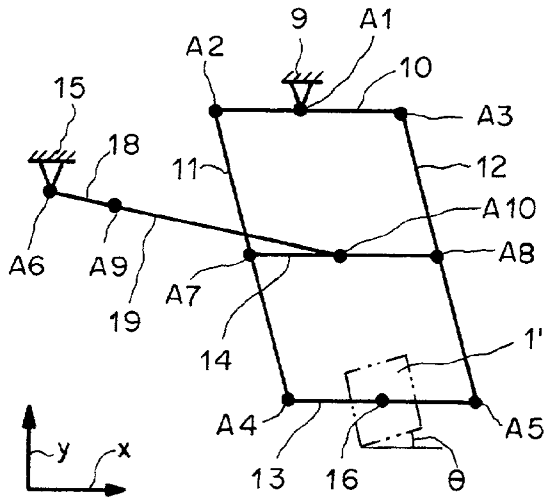
Figure 3B:
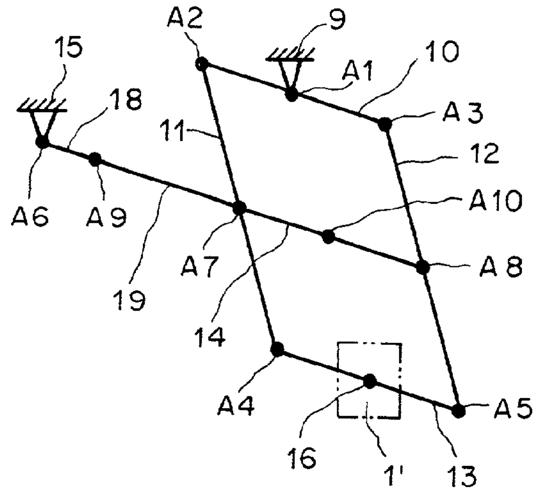
Figure 3C:
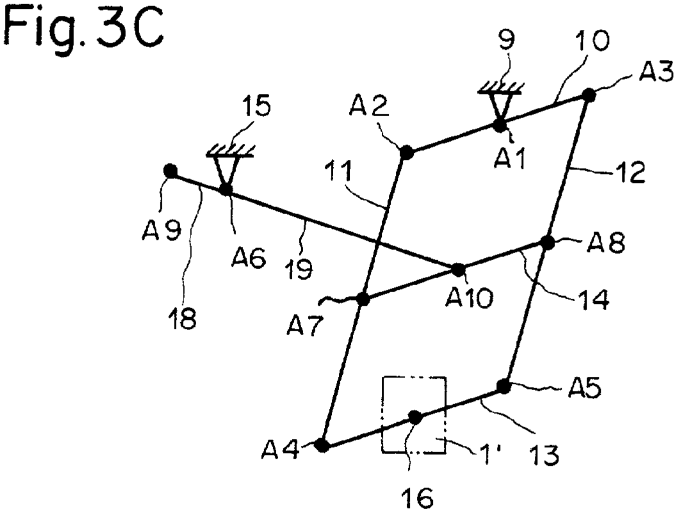
Figure 4:
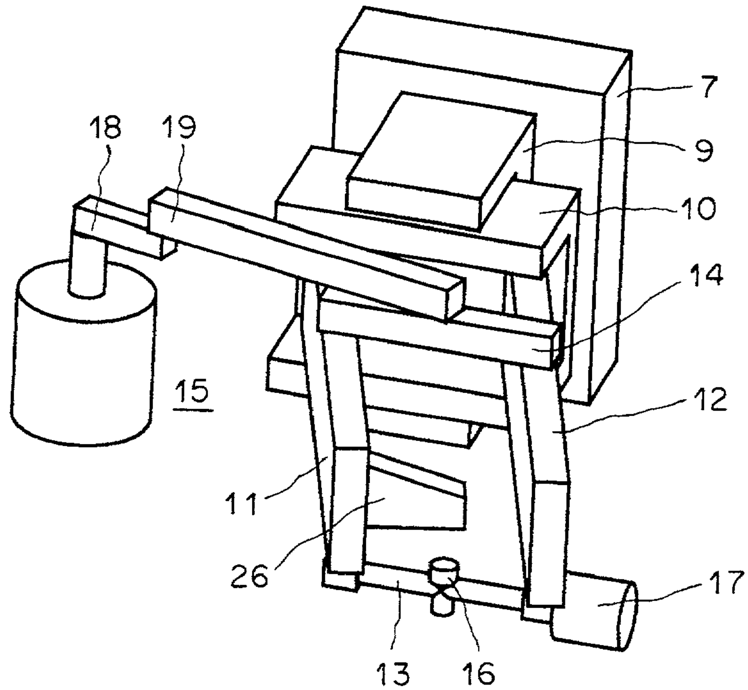
Figure 5:
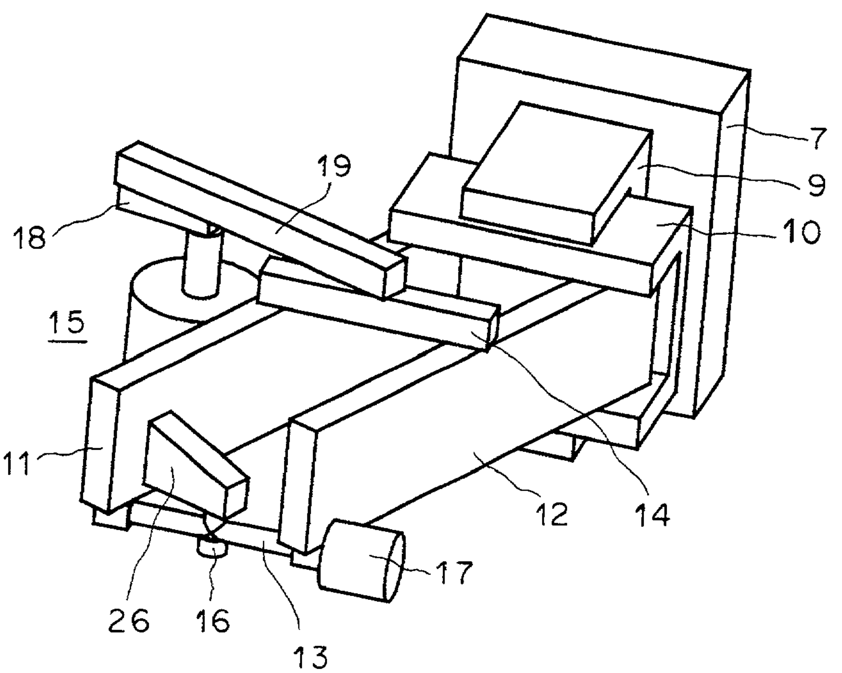

In the drawings:

FIG. 1 shows a die bonder with a flip device for flipping a semiconductor chip, FIG. 2 shows the flip device in detail, FIG. 3A-C show the flip device in various states, FIGS. 4, 5 shows a further flip device with a force unit, and FIG. 6 shows the force unit.

DETAILED DESCRIPTION OF THE INVENTION

FIG. 1 shows schematically a plan view of a die bonder for the placing of semiconductor chips 1 on a substrate 2. The three coordinate axes of a system of Cartesian co-ordinates are designated with x, y and z whereby the z axis corresponds to the vertical direction. The die bonder comprises a transport system 3 for transporting the substrate in x direction and, optionally, also in y direction. A suitable transport system 3 is, for example, described in the European patent EP 330 831. The semiconductor chips 1 are preferably presented on a wafer table 4 one after the other at a location A. A pick and place system 5, for example the pick and place system described in European patent application EP 923 111, takes the semiconductor chip 1 at location A and transports it to a location B above the substrate 2 where it delivers the semiconductor chip 1 to a flip device 6. The flip device 6 turns the semiconductor chip 1 by 180° and places it on the substrate 2 as a flipchip at a location C. Preferably, the flip device 6 is designed so that any positional error of the semiconductor chip 1 to be placed can be corrected during transport from location B to location C.

FIG. 2 shows a detailed and perspective presentation of the flip device 6. The flip device 6 comprises a rigidly arranged support 7, a slide 9 moveable on the support 7 in vertical direction 8, a support bracket 10 bearing on the slide 9 and which can be rotated on a vertical axis A1, two identical swivel arms 11 and 12 bearing on the support bracket 10, a first and a second connecting arm 13 and 14 which connect the two swivel arms 11, 12, a drive system 15 to swivel the two swivel arms 11, 12, a chip gripper 16 mounted on the first connecting arm 13 and a drive 17 for rotating the first connecting arm 13 on its longitudinal axis and thereby the chip gripper 16 by 180°.

The support bracket 10 has two vertical bearing axes A2 and A3 arranged at distance A on which one end each of the first swivel arm 11 and the second swivel arm 12 bear. The first connecting arm 13 also has two vertical bearing axes A4 and A5 arranged at distance A on which the other end of the first swivel arm 11 and the second swivel arm 12 bear. The support bracket 10, the two swivel arms 11 and 12 and the first connecting arm 13 form a parallelogram construction.

The drive system 15 consists essentially of a crank 18 which can be turned on a vertical axis A6 and a drive rod 19 one end of which bears on the outer end of the crank 18 and the other end of which bears on the second connecting arm 14. One end of the second connecting arm 14 bears on swivel arm 11 in a vertically running axis A7, the other end of the second connecting arm 14 bears on swivel arm 12 in a vertically running axis A8. The bearing axes of the drive rod 19 also run vertically and are designated with the reference marks A9 and A10. Bearing axis A1 runs at distance B to bearing axis A2. Bearing axis A10 runs at distance B to bearing axis A7. The chip gripper 16 is arranged on the first connecting arm 13 at distance B to bearing axis A4. The bearing axes A1, A10 and the chip gripper 16 are therefore located on a straight line running parallel to the swivel arms 11 and 12. The bearing axes A7 and A8 are arranged at distance C to the bearing axes A2 and A3 so that the second connecting arm 14 is aligned parallel to the support bracket 10 and parallel to the first connecting arm 13. The advantage of the parallelogram construction lies in that the first connecting arm 13 is always aligned parallel to the support bracket 10. In this way, any positional error of the semiconductor chip 1 can be completely eliminated by means of a correctional movement of the support bracket 10.

The drive system 15 serves the back and forth movement of the chip gripper 16 between a first and a second limit position which are preferably mechanically defined by means of the extended positions of the crank 18 and the drive rod 19. Extended position means that the crank 18 and the drive rod 19 point in the same direction, ie, the bearing axes A6, A9 and A10 lie on a straight line. This has the advantage that any positional error of the drive system 15 has practically no effect on the position of the chip gripper 16.

FIG. 3A shows schematically a plan view of the parallelogram construction which is in the first limit position. In addition, the support bracket 10 is aligned parallel to the x axis. In this position, the semiconductor chip 1', the upper surface of which has bumps, which was transported by a pick and place system (FIG. 1) is delivered to the flip device, ie, the semiconductor chip 1' is deposited on the upward facing chip gripper 16 by a bondhead of the pick and place system 5 and is secured there preferably by means of vacuum. In doing so, the bumps of the semiconductor chip 1' face upwards. After this step, the semiconductor chip 1' presented in FIG. 3A is possibly shifted by a vector $\Delta x$, $\Delta y$ in relation to its set position on the substrate and rotated by an angle $\Delta\theta$ in relation to the x axis. The angle error of the semiconductor chip 1' characterised by the angle $\Delta\theta$ can be corrected by means of turning the support bracket 10 on the rotational axis A1. In doing so, the axis A10 serves as a reference. FIG. 3B shows the parallelogram construction in this condition where the support bracket 10 is rotated by angle $-\Delta\theta$ in relation to its original position. The semiconductor chip 1' is now aligned parallel to the x direction. For the time being, the direction of the swivel arms 11, 12 is unchanged. The positional error of the semiconductor chip 1' characterised by the vector $\Delta x$, $\Delta y$ can be eliminated for example by means of a correctional movement of the substrate in x and in y direction. A further possibility exists in bearing the slide 9 on the support 7 in such a way that, apart from the vertical movement, it can also carry out movements in x and y direction. To do this, two micromanipulators are foreseen, for example, which enable a movement of the slide 9 in x and in y direction by typically some 10 s up to some 100 s of μm in relation to the support 7. These correctional movements take place before the chip gripper 16 deposits the semiconductor chip 1' on the substrate 2 (FIG. 1).

The drive system 15 now brings the parallelogram construction into the second limit position in that the crank 18 is turned by an angle determined according to the selected geometric relationship until the crank 18 and the drive rod 19 are located in the second extended position. This second limit position is presented in FIG. 3C. The orientation of the semiconductor chip 1' is not changed by this movement of the parallelogram construction.

As an alternative to the drive system 15 working with two extended positions, an elastic drive system can be used which brings the parallelogram construction to a first stop in the first limit position and to a second stop in the second limit position. However, the drive force must be applied via the axis A10 as the axis A10 is necessary as a reference for the correction of a possible angle error $\Delta\theta$.

Different movements run parallel to the shifting of the parallelogram construction from its first limit position to its second limit position:

a) The chip gripper 16 is turned through 180° by the drive 17 so that the bumps of the semiconductor chip 1' now face downwards.
b) The slide 9 is raised in vertical direction 8 and lowered again in order to prevent the semiconductor chip 1' rotating with the chip gripper 16 from touching the substrate.
c) A possible angle error of the semiconductor chip 1 is corrected by means of turning the support bracket 10. In doing so, the turning movement of the support bracket 10 is applied to the semiconductor chip 1' without offset.
d) A possible positional error of the semiconductor chip 1' is corrected by means of appropriate correctional movements of either the slide 9 by means of the micromanipulators or the substrate 2.

As soon as the parallelogram construction has reached its second limit position, the slide 9 is lowered to a predetermined height H above the substrate 2 or above a support plate on which the substrate 2 lies. As soon as the semiconductor chip impacts on the substrate 2, the chip gripper 16 is deflected in relation to the slide 9 against the force of a spring. The height H is set so that the semiconductor chip is pressed against the substrate 2 (FIG. 1) with a predetermined bond force. (This procedure is generally known as overtravel).

With this first embodiment, acquisition of the position of the semiconductor chip 1 (FIG. 1) takes place after it has been presented at location A by the wafer table by means of a first camera mounted above the location A, ie, immediately before being picked at location A. By means of a second camera, the substrate 2 is also measured at location C. From this data, a possible deviation of the actual position of the semiconductor chip from its set position on the substrate 2 is calculated and corrected before depositing at location C as explained above.

In order to increase the placement accuracy, in a further embodiment it is foreseen to mount a camera above the location B so that the chip gripper 16 is located in the field of vision of the camera and the position of the semiconductor chip 1' is only measured when the semiconductor chip 1' is held by the chip gripper 16 of the flip device. This solution has the advantage that the semiconductor chip 1' is measured in the position in which it is placed on the substrate 2 by the chip gripper 16.

With certain applications, a comparatively high bond force is necessary for placing the semiconductor chip 1' on the substrate. Rather then transferring this bond force from the slide 9 over the swivel arms 11 and 12 to the chip gripper 16, it can be advantageous to transfer this bond force by means of a force unit 26 arranged rigidly on the first swivel arm 11 as shown in FIGS. 4 and 5. FIG. 4 shows the flip device in the first limit position in which the chip gripper 16 is ready to accept the next semiconductor chip. In this limit position, the force unit 26 is located behind the chip gripper 16 so that the semiconductor chip can easily be deposited onto the chip gripper 16 by the pick and place system 5 (FIG. 1). FIG. 5 shows the flip device in the second limit position in which the now flipped semiconductor chip is placed onto the substrate 2 (FIG. 1). With the swivelling of the first swivel arm 11, the position of the force unit 26 has changed in relation to the position of the chip gripper 16 in such a way that the force unit 26 is now located directly above the chip gripper 16. The force unit 26 has a plunger movable in vertical direction which can be driven, for example, pneumatically, hydraulically or electro-mechanically. The placing of the semiconductor chip on the substrate should take place with a predetermined bond force which, with certain applications, can be relatively large. For this purpose, the plunger of the force unit 26 is lowered so that it presses the chip gripper 16 against the substrate 2 with the predetermined bond force.

With a preferred design presented schematically in FIG. 6, the plunger is a pressure cylinder 27 to which a predetermined pressure is applied which, in the neutral position, rests on a stop 28 of the force unit 26. To build up the bond force, the force unit 26 works together with the chip gripper 16 as follows: As already mentioned, in the second limit position of the parallelogram construction, the force unit 26 is located above the chip gripper 16. To place the semiconductor chip, the slide 9 is lowered to a predetermined height H as mentioned above. As soon as the semiconductor chip impacts on the substrate 2 (FIG. 1), a force builds up between the substrate 2 and the semiconductor chip which leads to the chip gripper 16 being deflected upwards. In doing so, the upper end of the chip gripper 16 comes to a stop inside the pressure cylinder 27. The height H is predetermined so that in any case the pressure cylinder 27 is deflected in relation to the force unit 26 so that the force with which the semiconductor chip is pressed onto the substrate 2 corresponds to the predetermined bond force. The advantage of this embodiment lies in that the bond force is independent of thickness deviations of the substrate 2.

Because of the back and forth movement of the two swivel arms 11, 12 and because of the correction possibility for the angle $\Delta\theta$, the parallelogram construction formed from the support bracket 10, the first swivel arm 11, the second swivel arm 12 and the connecting arm 13 is extended by the second connecting arm 14. Mechanically, this leads to a redundancy and necessitates a loose bearing, ie, allowing a certain play, of the first connecting arm 13 or the second connecting arm 14. Preferred is the loose bearing of the first connecting arm 13 with the bearing axis A5.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for placing a semiconductor chip as a flipchip on a substrate, comprising a flip device for flipping the semiconductor chip, the flip device being formed as a parallelogram construction having a support bracket, a first and a second swivel arm and a connecting arm and a chip gripper arranged on the connecting arm, and a drive system for the back and forth movement of the parallelogram construction between a first limit position where the chip gripper accepts the semiconductor chip and a second limit position where the chip gripper places the semiconductor chip on the substrate.

2. The apparatus according to claim 1, wherein the parallelogram construction is arranged on a slide moveable in a vertical direction and wherein the support bracket is turnable in relation to the slide on a vertical rotational axis.

3. The apparatus according to claim 1, wherein the first limit position and the second limit position of the parallelogram construction are defined mechanically by means of extended positions of the drive system.

4. The apparatus according to claim 2, wherein the first limit position and the second limit position of the parallelogram construction are defined mechanically by means of extended positions of the drive system.

5. The apparatus according to claim 1, wherein a force unit is arranged on the first swivel arm which serves to produce the force to be created between the semiconductor chip and the substrate when placing.

6. The apparatus according to claim 2, wherein a force unit is arranged on the first swivel arm which serves to produce the force to be created between the semiconductor chip and the substrate when placing.

7. The apparatus according to claim 3, wherein a force unit is arranged on the first swivel arm which serves to produce the force to be created between the semiconductor chip and the substrate when placing.

8. The apparatus according to claim 4, wherein a force unit is arranged on the first swivel arm which serves to produce the force to be created between the semiconductor chip and the substrate when placing.

9. The apparatus according to claim 5, wherein the force unit has a pressure cylinder to which a predetermined pressure can be applied which acts upon the chip gripper when placing the semiconductor chip on the substrate.

10. The apparatus according to claim 6, wherein the force unit has a pressure cylinder to which a predetermined pressure can be applied which acts upon the chip gripper when placing the semiconductor chip on the substrate.

11. The apparatus according to claim 7, wherein the force unit has a pressure cylinder to which a predetermined pressure can be applied which acts upon the chip gripper when placing the semiconductor chip on the substrate.

12. The apparatus according to claim 8, wherein the force unit has a pressure cylinder to which a predetermined pressure can be applied which acts upon the chip gripper when placing the semiconductor chip on the substrate.

13. The apparatus according to claim 1, wherein the apparatus is a die bonder comprising a pick and place system which picks a semiconductor chip from a wafer table and delivers the semiconductor chip to the flip device.

14. The apparatus according to claim 2, wherein the apparatus is a die bonder comprising a pick and place system which picks a semiconductor chip from a wafer table and delivers the semiconductor chip to the flip device.

15. The apparatus according to claim 3, wherein the apparatus is a die bonder comprising a pick and place system which picks a semiconductor chip from a wafer table and delivers the semiconductor chin to the flip device.

16. The apparatus according to claim 4, wherein the apparatus is a die bonder comprising a pick and place system which picks a semiconductor chip from a wafer table and delivers the semiconductor chip to the flip device.

17. The apparatus according to claim 5, wherein the apparatus is a die bonder comprising a pick and place system which picks a semiconductor chip from a wafer table and delivers the semiconductor chip to the flip device.

18. The apparatus according to claim 6, wherein the apparatus is a die bonder comprising a pick and place system which picks a semiconductor chip from a wafer table and delivers the semiconductor chip to the flip device.

19. The apparatus according to claim 7, wherein the apparatus is a die bonder comprising a pick and place system which picks a semiconductor chip from a wafer table and delivers the semiconductor chip to the flip device.

20. The apparatus according to claim 8, wherein the apparatus is a die bonder comprising a pick and place system which picks a semiconductor chip from a wafer table and delivers the semiconductor chip to the flip device.

* * * * *